(12) United States Patent
Hopper et al.

(10) Patent No.: US 6,958,194 B1
(45) Date of Patent: Oct. 25, 2005

(54) IMAGER WITH IMPROVED SENSITIVITY

(75) Inventors: Peter J. Hopper, San Jose, CA (US);
Philipp Lindorfer, San Jose, CA (US);
Michael Mian, Livermore, CA (US);
Robert Drury, Santa Clara, CA (US)

(73) Assignee: Foveon, Inc., Santa Clara, CA (US)

( * ) Notice: Subject to any disclaimer, the term of this patent is extended or adjusted under 35 U.S.C. 154(b) by 0 days.

(21) Appl. No.: 10/689,779

(22) Filed: Oct. 21, 2003

(51) Int. Cl.[7] .......................... B32B 9/00; H01L 31/00
(52) U.S. Cl. ...................... 428/641; 428/620; 428/446; 257/431; 257/440; 257/291; 438/24; 438/48; 438/584
(58) Field of Search ................................ 428/446, 641, 428/620; 257/225, 440, 291, 431; 438/24, 48, 584

(56) References Cited

U.S. PATENT DOCUMENTS

| | | | |
|---|---|---|---|
| 5,562,781 A | 10/1996 | Ingram et al. | 136/249 |
| 5,932,873 A | 8/1999 | Bergemont et al. | 250/208.1 |
| 5,962,844 A | 10/1999 | Merrill et al. | 250/214 A |
| 5,965,875 A | 10/1999 | Merrill | 250/226 |
| 5,970,316 A | 10/1999 | Merrill | 438/57 |
| 5,982,012 A | 11/1999 | Merrill | 257/463 |
| 6,002,432 A | 12/1999 | Merrill et al. | 348/241 |
| 6,018,365 A | 1/2000 | Merrill | 348/302 |
| 6,066,510 A | 5/2000 | Merrill | 438/57 |
| 6,088,058 A | 7/2000 | Mead et al. | 348/296 |
| 6,150,683 A | 11/2000 | Merrill et al. | 257/292 |
| 6,160,282 A | 12/2000 | Merrill | 257/292 |
| 6,211,510 B1 | 4/2001 | Merrill et al. | 250/208.1 |
| 6,246,043 B1 | 6/2001 | Merrill | 250/208.1 |
| 6,281,561 B1 | 8/2001 | Stiebig et al. | 257/440 |
| 6,310,382 B1 | 10/2001 | Stiebig et al. | 257/440 |
| 6,369,853 B1 | 4/2002 | Merrill et al. | 348/302 |
| 6,410,899 B1 | 6/2002 | Merrill et al. | 250/208.1 |
| 6,452,633 B1 | 9/2002 | Merrill et al. | 348/302 |
| 6,476,372 B2 | 11/2002 | Merrill et al. | 250/208.1 |
| 6,512,544 B1 | 1/2003 | Merrill et al. | 348/302 |
| 6,525,304 B1 | 2/2003 | Merrill et al. | 250/208.1 |
| 6,606,120 B1 | 8/2003 | Merrill et al. | 348/273 |
| 6,632,701 B2 | 10/2003 | Merrill | 438/70 |
| 6,636,261 B1 | 10/2003 | Pritchard et al. | 348/308 |
| 6,697,114 B1 | 2/2004 | Merrill | 348/308 |
| RE38,499 E | 4/2004 | Merrill et al. | 348/301 |
| 6,727,521 B2 | 4/2004 | Merrill | 257/98 |
| 6,731,397 B1 | 5/2004 | Merrill et al. | 358/1.16 |
| 6,741,283 B1 | 5/2004 | Merrill et al. | 348/308 |
| 6,760,070 B1 | 7/2004 | Merrill et al. | 348/294 |
| 2002/0058353 A1 | 5/2002 | Merrill | 438/57 |

OTHER PUBLICATIONS

U.S. patent application Ser. No. 10/219,836, Hopper et al., filed Aug. 15, 2002.

*Primary Examiner*—Stephen Stein
(74) *Attorney, Agent, or Firm*—Sierra Patent Group, Ltd.

(57) ABSTRACT

An imaging cell reduces recombination losses and increases sensitivity by forming a low resistance lateral path with a silicon germanium layer of a conductivity type that is sandwiched between silicon layers of the same conductivity type. The silicon germanium layer also provides a quantum well from which photo-generated electrons find it difficult to escape, thereby providing a barrier that reduces cross-talk.

29 Claims, 6 Drawing Sheets

IMAGER WITH IMPROVED SENSITIVITY

BACKGROUND OF THE INVENTION

1. Field of the Invention

The present invention relates to imagers and, more particularly, to an imager with improved sensitivity.

2. Description of the Related Art

A black and white imager is a device that utilizes a photodiode to convert light into photo-generated electrons, and a transistor circuit to collect and determine the number of photo-generated electrons that were generated during a time interval commonly known as an integration period.

A color imager is a device that converts light, which includes a number of different wavelengths, into photo-generated electrons, and then separately collects the photo-generated electrons that were generated from the different wavelengths of light. For example, a color imager can separately collect the red electrons that were formed from red light, the green electrons that were formed from green light, and the blue electrons that were formed from blue light. The color imagers in digital cameras utilize millions of color cells that capture images based on the amount of red, green, and blue light that strikes the cells.

One approach to implementing a color imager is to utilize a first imaging cell with a red filter that lies over a first photodiode, a second imaging cell with a green filter that lies over a second photodiode, and a third imaging cell with a blue filter that lies over a third photodiode. The red filter of the first imaging cell only passes red light which, in turn, allows the first photodiode to produce and collect only red photo-generated electrons.

Similarly, the green filter of the second imaging cell only passes green light which allows the second photodiode to produce and collect only green photo-generated electrons, and the blue filter of the third imaging cell only passes blue light which allows the third photodiode to produce and collect only blue photo-generated electrons. One drawback with this approach is that three photodiodes are required which, in turn, requires a substantial amount of silicon real estate.

Another approach to implementing a color imager that addresses the size problems of the three-cell approach is a vertical color imager. A vertical color imager is an imager that separately collects the photo-generated electrons that represent the different colors, such as red, green, and blue.

A vertical color imager can be implemented with a number of vertical color imaging cells that each include, for example, six regions of alternating p-type and n-type conductivities that form five vertically-aligned pn junctions. The first pn junction, which is furthest from the top surface of the top region, forms a red pn junction, while the third pn junction forms a green pn junction and the fifth pn junction, which is closest to the top surface of the top region, forms a blue pn junction.

The red pn junction has a depth from the top surface of the top region that is approximately equal to the absorption depth of red light in silicon. In addition, the green pn junction has a depth from the top surface that is approximately equal to the absorption depth of green light, and the blue pn junction has a depth from the top surface that is approximately equal to the absorption depth of blue light.

Electrical connections to the five lower regions can be made by forming sinker regions that extend from the top surface down to the regions. For example, an electrical connection to the bottom n region can be made with an n+ sinker region that vertically extends from the top surface to the bottom n region. The electrical connections to the regions are typically formed in a square or rectangular fashion, leaving a center area free from obstruction.

In addition, a transistor circuit, which determines the number of photo-generated electrons that were generated and collected during an integration period, can also be formed around the center area on the top surface of the top region. The transistors utilize a relatively small amount of space with respect to the amount of area utilized by the photodiode. Thus, one of the advantages of a vertical color imaging cell is that since the cell collects multiple colors, a vertical color imaging cell is only slightly larger than a black and white imaging cell.

Figure 1:
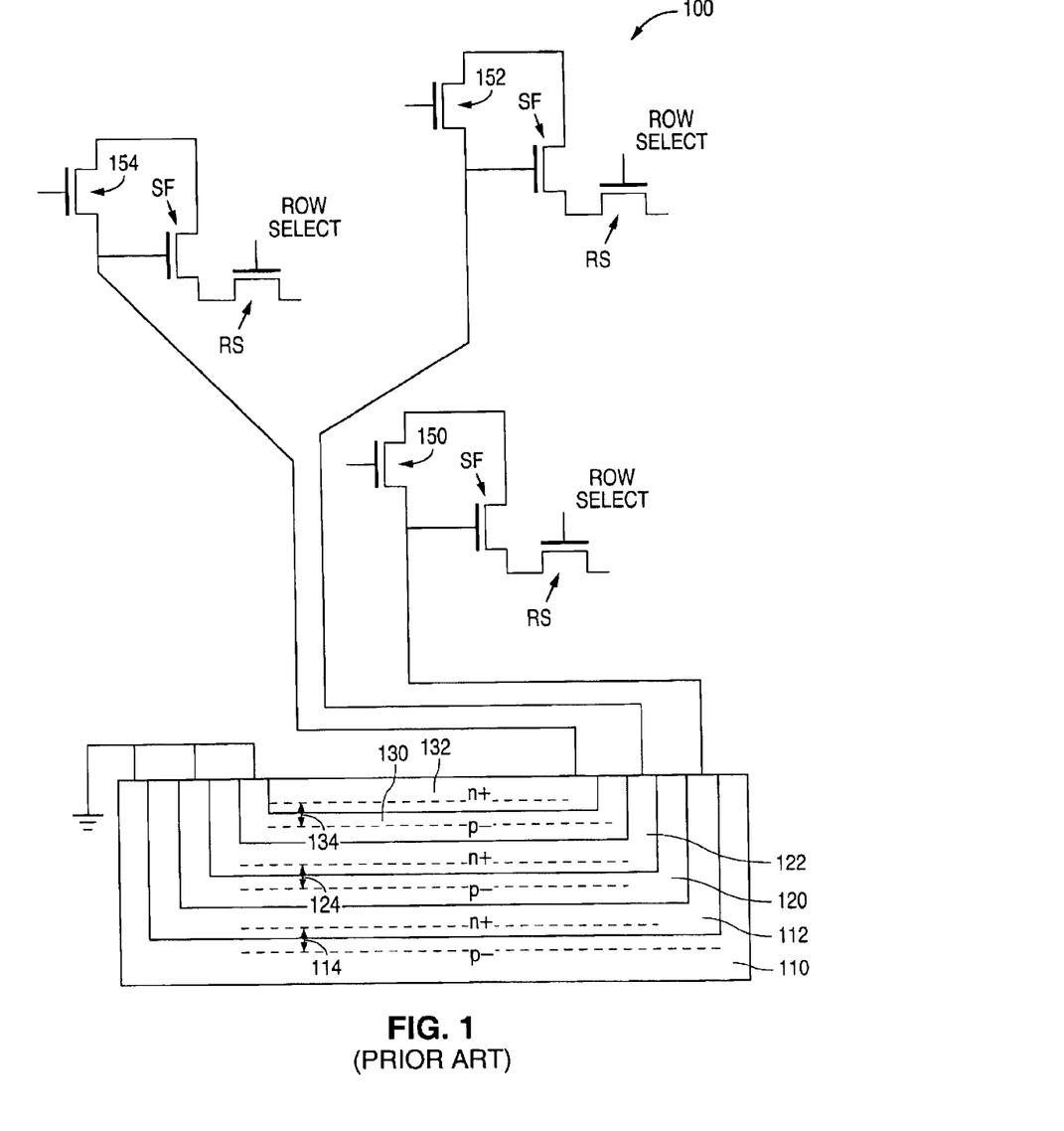
FIG. 1 is a combined cross-sectional and schematic diagram illustrating a prior art vertical color imaging cell 100.

One example of a vertical color imaging cell is taught by U.S. Patent Application Publication US 2002/0058353 A1 published on May 16, 2002. FIG. 1 shows a combined cross-sectional and schematic diagram that illustrates a prior art vertical color imaging cell 100. Cell 100 is substantially the same as the cell shown in FIG. 2A of the '353 published application.

As shown in FIG. 1, imaging cell 100 includes a red p– region 110, a red n+ region 112 that contacts p– region 110, and a red depletion region 114 that is formed at the junction between regions 110 and 112. Imaging cell 100 also includes a green p– region 120 that contacts n+ region 112, a green n+ region 122 that contacts p– region 120, and a green depletion region 124 that is formed at the junction between regions 120 and 122. In addition, imaging cell 100 further includes a blue p– region 130 that contacts n+ region 122, a blue n+ region 132 that contacts p– region 130, and a blue depletion region 134 that is formed at the junction between regions 130 and 132.

Further, imaging cell 100 includes first, second, and third reset transistors 150, 152, and 154 which are connected to n+ regions 112, 122, and 132, respectively, while p– regions 110, 120, and 130 are connected to ground. Prior to collecting photo information, reset transistors 150, 152, and 154 are pulsed on which, in turn, places a positive potential on n+ regions 112, 122, and 132.

The positive potential reverse biases the pn junction of regions 110 and 112, thereby increasing the width of red depletion region 114, and the pn junction of regions 120 and 122, thereby increasing the width of green depletion region 124. The positive potential also reverse biases the pn junction of regions 130 and 132, thereby increasing the width of blue depletion region 134.

Once the positive potentials have been placed on n+ regions 112, 122, and 132, light energy, in the form of photons, is collected by the red, green, and blue photodiodes. The red photons are absorbed by the red photodiode which, in turn, forms a number of red electron-hole pairs, while the green photons are absorbed by the green photodiode which, in turn, forms a number of green electron-hole pairs. Similarly, the blue photons are absorbed by the blue photodiode which, in turn, forms a number of blue electron-hole pairs.

The red electrons from the electron-hole pairs that are formed in depletion region 114 move under the influence of the electric field towards n+ region 112. On the other hand, the holes formed in depletion region 114 move under the influence of the electric field towards p– region 110.

In addition, the electrons, which are from the electron-hole pairs that are formed in p– region 110 within a diffusion length of depletion region 114, diffuse to depletion region 114 and are swept to n+ region 112 under the influence of the electric field. Further, the electrons that are formed in n+ region 112 remain in n+ region 112. Each additional electron collected by n+ region 112 reduces the positive potential that was placed on n+ region 112 by reset transistor 150.

Similarly, the green electrons from the electron-hole pairs that are formed in depletion region 124 move under the influence of the electric field towards n+ region 122. On the other hand, the holes formed in depletion region 124 move under the influence of the electric field towards p– region 120.

In addition, the electrons, which are from the electron-hole pairs that are formed in p– region 120 within a diffusion length of depletion region 124, diffuse to depletion region 124 and are swept to n+ region 122 under the influence of the electric field. Further, the electrons that are formed in n+ region 122 remain in n+ region 122. Each additional electron collected by n+ region 122 reduces the positive potential that was placed on n+ region 122 by reset transistor 152.

As with the red and green electrons, the blue electrons from the electron-hole pairs that are formed in depletion region 134 move under the influence of the electric field towards n+ region 132. On the other hand, the holes formed in depletion region 134 move under the influence of the electric field towards p– region 130.

In addition, the electrons, which are from the electron-hole pairs that are formed in p– region 130 within a diffusion length of depletion region 134, diffuse to depletion region 134 and are swept to n+ region 132 under the influence of the electric field. Further, the electrons that are formed in n+ region 132 remain in n+ region 132. Each additional electron collected by n+ region 132 reduces the positive potential that was placed on n+ region 132 by reset transistor 154.

After the red, green, and blue photodiodes have collected light energy for an integration period, sense circuitry associated with the photodiodes detects the change in potential on n+ regions 112, 122, and 132. Specifically, in addition to a reset transistor, each photodiode also has an associated source follower transistor SF and a row select transistor RS.

The change in potential on an n+ region is present on the gate of the associated source follower transistor SF, while the source of the source follower transistor SF is one diode drop below the potential. Thus, when the gate of the row select transistor RS is pulsed, an output potential equal to the photodiode potential less a diode drop is output to a sense cell to determine the output potential. Once the change in positive potential has been determined, the photodiodes are reset and the process is repeated.

One problem with imaging cell 100 is that, in addition to moving vertically to a contact point located on the top surface, many of the red, green, and blue electrons must also move laterally to be collected. The electrons, however, have relatively-short, recombination lifetimes which, in turn, limits the distances the electrons can travel.

Another problem with vertical color imaging cell 100 is that the electrons from one n region, such as the green n+ region 122, can be collected by another n region, such as the red n+ region 112. This cross talk, where electrons from one n region are collected by another n region, reduces the sensitivity of the cell.

DETAILED DESCRIPTION OF THE INVENTION

Figure 2:
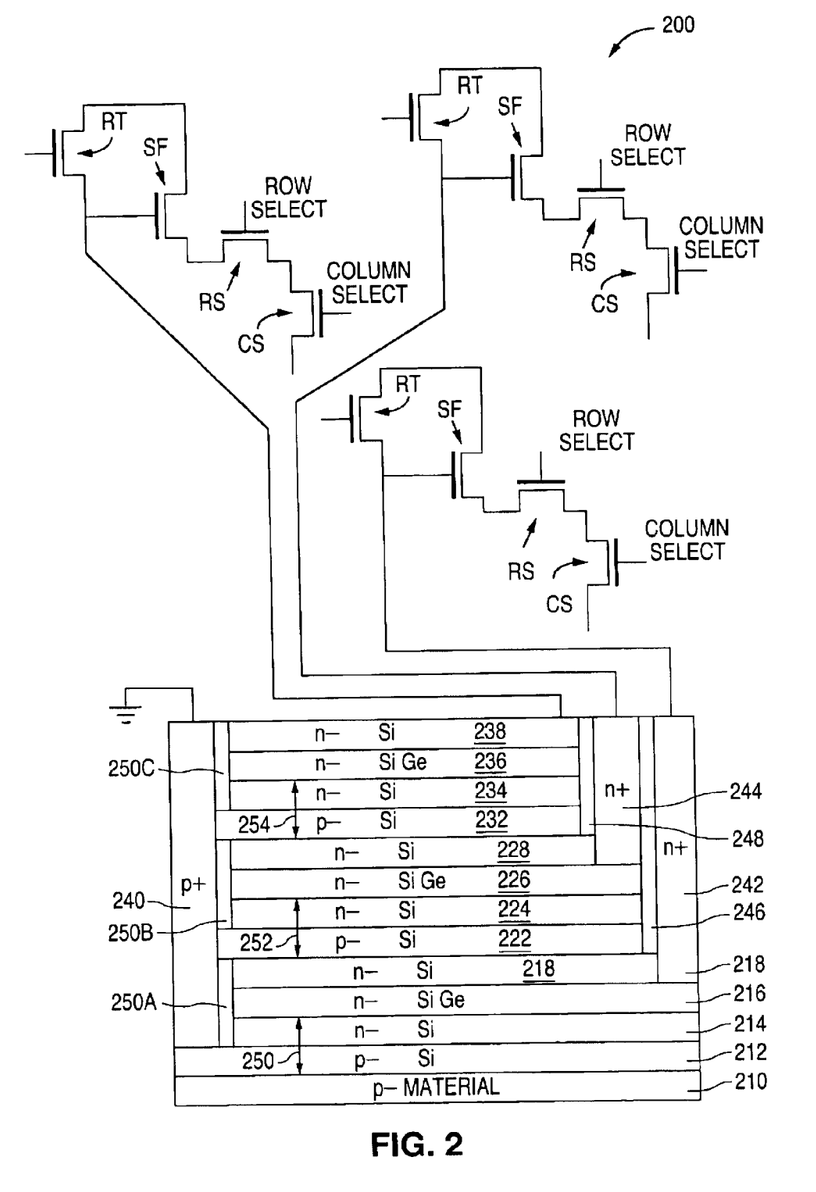
FIG. 2 is a combined cross-sectional and schematic diagram illustrating an example of an imaging cell 200 in accordance with the present invention.

FIG. 2 shows a combined cross-sectional and schematic diagram that illustrates an example of an imaging cell 200 in accordance with the present invention. As described in greater detail below, cell 200 provides low resistance barriers between the vertically aligned photodiodes to reduce recombination losses and increase sensitivity.

As shown in FIG. 2, cell 200, which is formed on a p– material 210, such as a substrate, well, or epitaxial layer, includes a p– silicon region 212 that is formed on material 210, and an n– silicon region 214 that is formed on p– silicon region 212. Optionally, p– silicon region 212 can include a p+ region that lies at the bottom of p– silicon region 212.

In addition, cell 200 includes an n-type silicon germanium region 216 that is formed on n– silicon region 214, and an n-type silicon region 218 that is formed on n-type silicon germanium region 216. Both n-type silicon germanium region 216 and n-type silicon region 218 can have an n– up to an n+ dopant concentration.

Cell 200 also includes a p– silicon region 222 that is formed on n– type silicon region 218, and an n– silicon region 224 that is formed on p– silicon region 222. Optionally, p– silicon region 222 can include a p+ region that lies at the bottom of p– region 222 adjacent to n-type silicon region 218.

Further, cell 200 includes an n-type silicon germanium region 226 that is formed on n– silicon region 224, and an n-type silicon region 228 that is formed on n-type silicon germanium region 226. Both n-type silicon germanium region 226 and n-type silicon region 228 can have an n– up to an n+ dopant concentration.

As additionally shown in FIG. 2, cell 200 includes a p– silicon region 232 that is formed on n-type silicon region 228, and an n– silicon region 234 that is formed on p– silicon region 232. Optionally, p– region 232 can include a p+ region that lies at the bottom of p– region 212 adjacent to n-type silicon region 228.

Further, cell 200 includes an n-type silicon germanium region 236 that is formed on n– silicon region 234, and an n-type silicon region 238 that is formed on n-type silicon germanium region 236. Both n-type silicon germanium region 236 and n-type silicon region 238 can have an n– up to an n+ dopant concentration.

Cell 200 also includes a p+ sinker 240 that is connected to p– regions 212, 222, and 232, and an n-type sinker 242 that is connected to n-type region 218 when region 218 has a high dopant concentration, and region 216 when region 218 has a low dopant concentration. In addition, cell 200 includes an n-type sinker 244 that is connected to n-type region 228 when region 228 has a high dopant concentration, and region 226 when region 228 has a low dopant concentration.

Sinker 242 can have an n+ dopant concentration and is electrically isolated from n-type regions 224, 226, 228, 234, 236, and 238 by an isolation region 246, while sinker 244 can have an n+ dopant concentration and is electrically isolated from n-type regions 234, 236, and 238. Sinker 240 can also be electrically isolated from regions 214, 216, 218, 224, 226, 228, 234, 236, and 238 by isolations regions 250A, 250B, and 250C.

As further shown in FIG. 2, imaging cell 200 can include three sets of control transistors, with each set having a reset transistor RT, a source-follower transistor SF, and a select transistor RS. The select transistor from each set can be either a row or column select transistor and can, for example, share the same select line. Sharing the same select line allows the three colors to be measured at the same time. In addition, each set can optionally include a second select transistor CS (a column or row select transistor) if an individual pixel read out is desired.

In operation, n-type regions 214/216/218, 224/226/228, and 234/236/238 are each electrically connected to a reset transistor RT, while p− regions 212, 222, and 224 are connected to ground. Prior to collecting photo information, the reset transistors RT are pulsed on which, in turn, places a positive potential on n-type regions 214/216/218, 224/226/228, and 234/236/238.

The positive potential reverse biases the pn junction between regions 212 and 214, thereby forming a red depletion region 250, and the pn junction between regions 222 and 224, thereby forming a green depletion region 252. The positive potential also reverse biases the pn junction between regions 232 and 234, thereby forming a blue depletion region 254.

In the present example, the magnitude of the positive potential is sufficient to deplete substantially all of n− silicon region 214, n− silicon region 224, and n− silicon region 234 such that red depletion region 250, green depletion region 252, and blue depletion region 254 touch or nearly touch silicon germanium regions 216, 226, and 236, respectively.

Once the positive potentials have been placed on n-type regions 214/216/218, 224/226/228, and 234/236/238, light energy, in the form of photons, is collected by the red, green, and blue photodiodes. The red photons are absorbed by the red photodiode which, in turn, forms a number of red electron-hole pairs, while the green photons are absorbed by the green photodiode which, in turn, forms a number of green electron-hole pairs. Similarly, the blue photons are absorbed by the blue photodiode which, in turn, forms a number of blue electron-hole pairs.

The red, green, and blue electrons from the electron-hole pairs that are formed in depletion regions 250, 252, and 254, respectively, move under the influence of the electric field towards n-type silicon germanium regions 216, 226, and 236, respectively. In addition, the electrons from the electron-hole pairs that are formed in p− regions 212, 222, and 224 within a diffusion length of depletion regions 250, 252, and 254, respectively, diffuse to depletion regions 250, 252, and 254, respectively.

The electrons are then swept through depletion regions 250, 252, and 254 to n-type silicon germanium regions 216, 226, and 236, respectively, under the influence of the electric field. Further, the electrons that are formed in n-type silicon regions 218, 228, and 238 remain in n-type silicon regions 218, 228, and 238, respectively.

In accordance with the present invention, each silicon germanium region 216, 226, and 236 provides a lower resistance lateral path to a collection point, such as a sinker or a contact, than an equivalently-doped region of silicon. As a result, fewer photo-generated electrons are lost to recombination as the electrons move laterally to the collection point.

In further accordance with the present invention, each silicon germanium region 216, 226, and 236 provides a quantum well from which the electrons find it difficult to escape. Silicon germanium has a lower band gap than silicon, approximately 0.7 eV versus approximately 1.1 eV.

As a result, when a photo-generated electrons diffuses into a silicon germanium region, the electron is unable to vertically leave the silicon germanium region unless the electron has or receives sufficient energy to overcome the energy band gap difference between silicon and silicon germanium.

Thus, the present invention reduces cross talk between adjacent regions by, for example, preventing a green electron from being collected by the red photodiode. In addition, cross talk can be further reduced by forming n-type silicon regions 218, 228, and 238 to have an n+ dopant concentration. The n+ dopant concentration provides a further barrier for electrons trying to escape the silicon germanium region.

When the photo-generated electrons are collected from n-type regions 214/216/218, 224/226/228, and 234/236/238, each additional electron reduces the positive potential that was placed on the n-type regions by the reset transistors RT. On the other hand, the holes formed in depletion regions 250, 252, and 254 move under the influence of the electric field towards p-type region 240.

After the red, green, and blue photodiodes have collected light energy for an integration period, the control transistors associated with the photodiodes detects the change in potential on the n-type regions. Specifically, the change in potential on each n-type region is present on the gate of the associated source follower transistor SF, while the source of the source follower transistor SF is one diode drop below the gate potential.

Thus, when the gate of a select transistor RS is pulsed, an output potential equal to the photodiode potential less a diode drop is output to a sense cell to determine the output potential. Once the change in positive potential has been determined, the photodiodes are reset and the process is repeated.

Figure 3A:
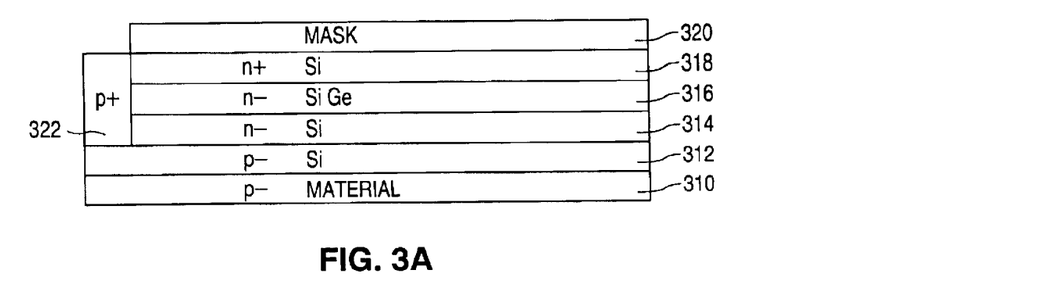
FIGS. 3A–3J are a series of cross-sectional views illustrating an example of a method of forming a photodiode in accordance with the present invention.

FIGS. 3A–3J show a series of cross-sectional views that illustrate an example of a method of forming a photodiode in accordance with the present invention. As shown in FIG. 3A, the method, which begins with a p− single crystal silicon layer 310, includes the step of epitaxially growing, in sequence, a p− silicon region 312 on layer 310, an n− silicon region 314 on region 312, and an n-type silicon germanium region 316 on region 314. The germanium is initially introduced at approximately 15% to reduce slippage at the crystal boundary, ramped up, and then ramped down.

After n− silicon germanium region 316 has been formed, an n-type silicon region is epitaxially grown on n− silicon germanium region 316. In the present example, following the formation of the n− silicon region, the surface of the n− silicon region is blanket implanted (non-imager locations can be masked to prevent the implant) to form n+ silicon region 318 on region 316. (The implant can also change the dopant concentration of region 316 to n+.)

Once region 330 has been formed, a mask 320 is formed and patterned on the top surface of n− silicon region 318. Following this, the exposed regions of n− silicon region 318 and the underlying regions are implanted with a p-type dopant, such as boron, to form a p-type sinker region 322 that contacts p− silicon region 312. Mask 320 is then removed.

Figure 3B:
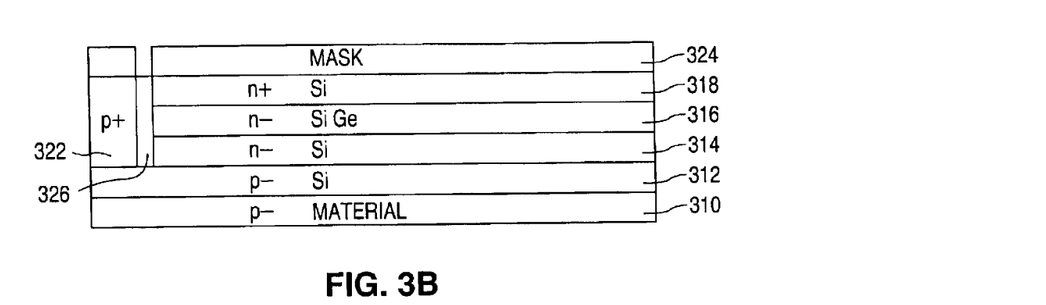

Next, as shown in FIG. 3B, a mask 324 is formed and patterned on the top surface of n− silicon region 318. Following this, the exposed regions of n− silicon region 318 and the underlying regions are etched to form a trench that exposes p− silicon region 312. Mask 324 is removed, and a trench isolation region 326 is formed in the trench using conventional methods.

Figure 3C:
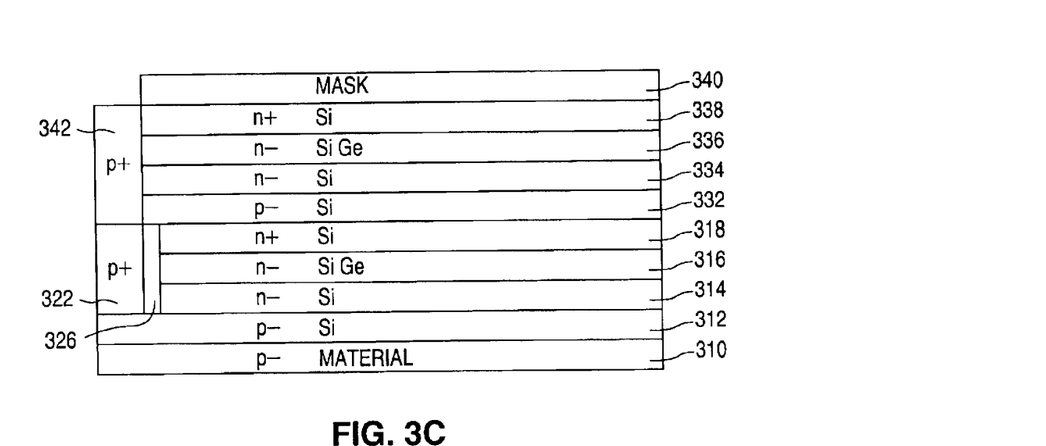

After this, as shown in FIG. 3C, the method continues by epitaxially growing, in sequence, a p− silicon region 332 on layer 330, an n– silicon region 334 on region 332, and an n-type silicon germanium region 336 on region 334. The germanium can be introduced during the epitaxial growth stage as indicated above.

Once n– silicon germanium region 336 has been formed, an n-type silicon region is epitaxially grown on n– silicon germanium region 336. In the present example, following the formation of the n– silicon region, the surface of the n– silicon region is blanket implanted (non-imager locations can be masked to prevent the implant) to form n+ silicon region 338 on region 336. (The implant can also change the dopant concentration of region 336 to n+.)

Next, a mask 340 is formed and patterned on the top surface of n+ silicon region 338. Following this, the exposed regions of n+ silicon region 338 and the underlying regions are implanted with a p-type dopant, such as boron, to form a p-type sinker region 342 that contacts p-type sinker 322. Mask 340 is then removed.

Figure 3D:
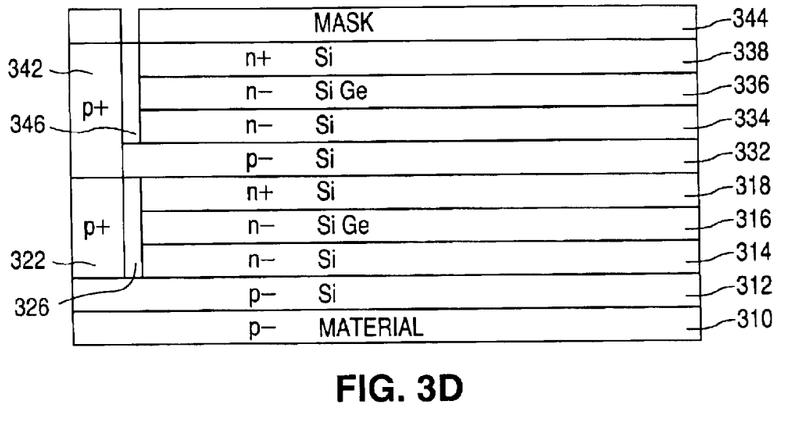

Next, as shown in FIG. 3D, a mask 344 is formed and patterned on the top surface of n+ silicon region 338. Following this, the exposed regions of n+ silicon region 338 and the underlying regions are etched to form a trench that exposes p– region 332. Mask 344 is removed, and a trench isolation region 346 is formed in the trench using conventional methods.

Figure 3E:
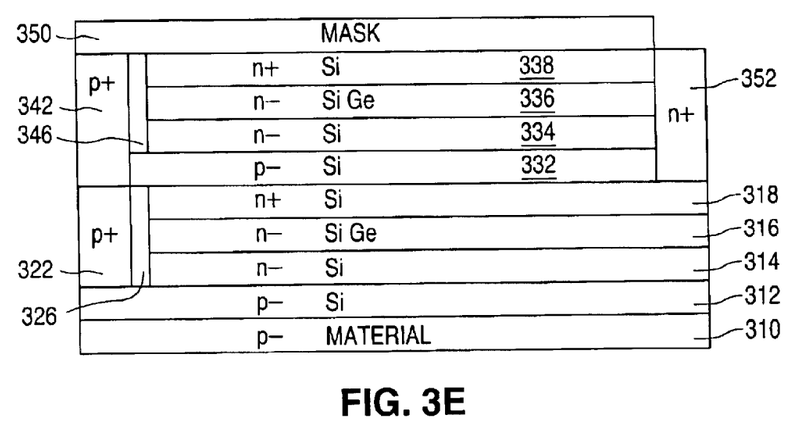

Once trench isolation region 346 has been formed, as shown in FIG. 3E, a mask 350 is formed and patterned on the top surface of n+ silicon region 338. Following this, the exposed regions of n+ silicon region 338 and the underlying regions are implanted with an n-type dopant, such as phosphorous, to form an n-type sinker 352 that contacts n+ silicon region 318. Mask 350 is then removed.

Figure 3F:
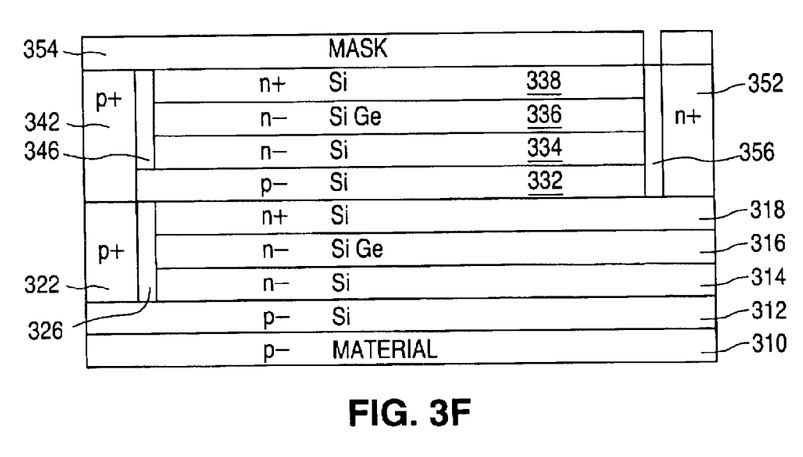

Next, as shown in FIG. 3F, a mask 354 is formed and patterned on the top surface of n+silicon region 338. Following this, the exposed regions of n+ silicon region 338 and the underlying regions are etched to form a trench that exposes n+ silicon region 318. Mask 354 is removed, and a trench isolation region 356 is formed in the trench using conventional methods.

Figure 3G:
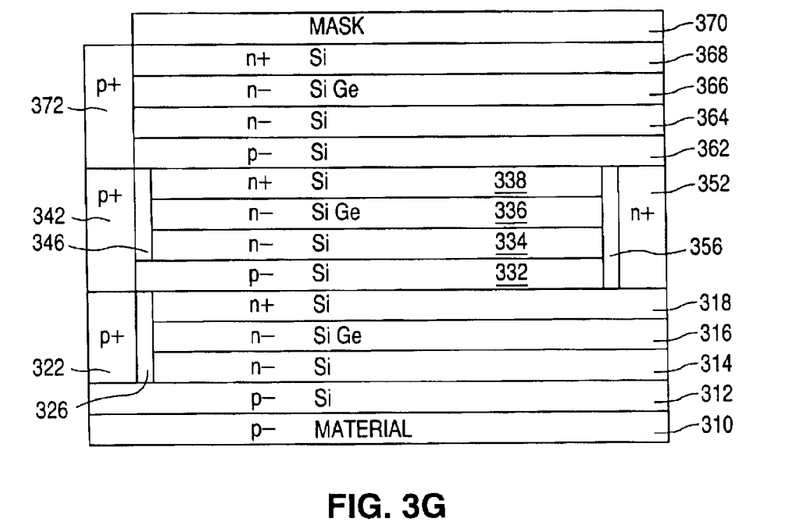

Once trench isolation region 356 has been formed, as shown in FIG. 3G, the method continues by epitaxially growing, in sequence, a p– silicon region 362 on layer 338, an n– silicon region 364 on region 362, and an n-type silicon germanium region 366 on region 314. The germanium can be introduced during the epitaxial growth stage as indicated above.

Once n– silicon germanium region 366 has been formed, an n-type silicon region is epitaxially grown on n– silicon germanium region 366. In the present example, following the formation of the n– silicon region, the surface of the n– silicon region is blanket implanted (non-imager locations can be masked to prevent the implant) to form n+ silicon region 368 on region 366. (The implant can also change the dopant concentration of region 336 to n+.)

Next, a mask 370 is formed and patterned on the top surface of n+ silicon region 368. Following this, the exposed regions of n+ silicon region 368 and the underlying regions are implanted with a p-type dopant, such as boron, to form a p-type sinker region 372 that contacts sinker region 342. Mask 370 is then removed.

Figure 3H:
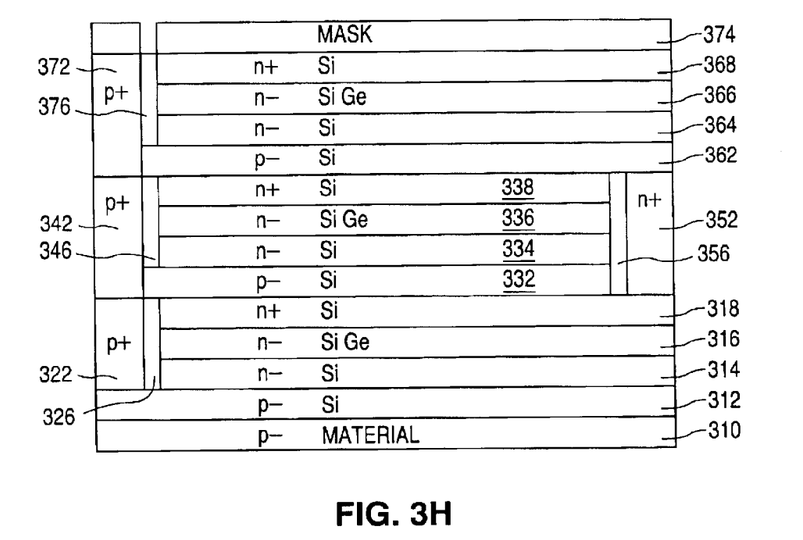

Next, as shown in FIG. 3H, a mask 374 is formed and patterned on the top surface of n+ silicon region 368. Following this, the exposed regions of n+ silicon region 368 and the underlying regions are etched to form a trench that exposes p– region 362. Mask 374 is removed, and a trench isolation region 376 is formed in the trench using conventional methods.

Figure 3I:
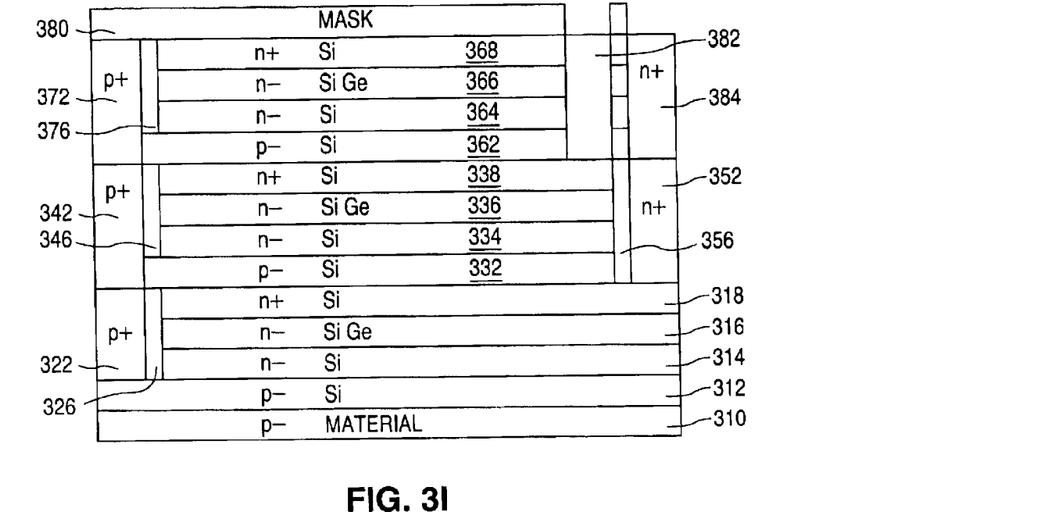

Once trench isolation region 376 has been formed, as shown in FIG. 3I, a mask 380 is formed and patterned on the top surface of n+ silicon region 368. Following this, the exposed regions of n+ silicon region 368 and the underlying regions are implanted with an n-type dopant, such as phosphorous, to form an n-type sinker 382 that contacts n+ silicon region 338, and an n-type sinker 384 that contacts sinker region 352. Mask 380 is then removed.

Figure 3J:
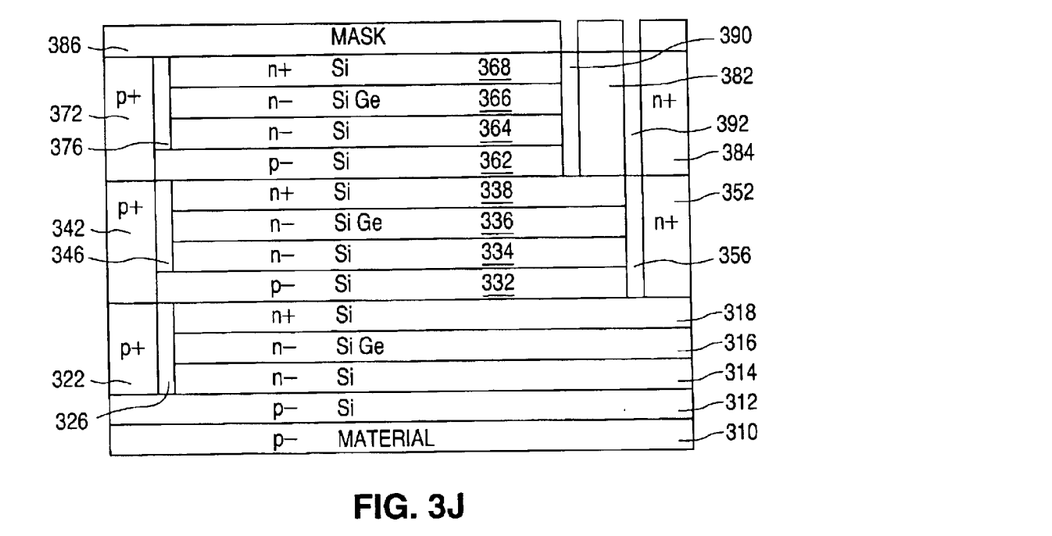

Next, as shown in FIG. 3J, a mask 386 is formed and patterned on the top surface of n+ silicon region 368. Following this, the exposed regions of n+ silicon region 368 and the underlying regions are etched to form a trench that exposes n+ silicon region 338 and a trench that exposes trench isolation region 356.

Mask 386 is removed, and a trench isolation region 390 is formed in the trench using conventional methods to contact n+ silicon region 338, and a trench isolation region 392 that contacts trench isolation region 356. Once trench isolation regions 390 and 392 have been formed, the method continues with conventional steps.

It should be understood that the above descriptions are examples of the present invention, and that various alternatives of the invention described herein may be employed in practicing the invention. For example, although the present invention has been described in terms of a vertical color cell, a silicon germanium region can be used with a black and white cell.

In this case, the black and white cell has a single p– silicon region, a single n– silicon region that is formed on the p– region, a single n-type silicon germanium region that is formed on the n– region, and a single n-type silicon region that is formed on the silicon germanium region. Thus, it is intended that the following claims define the scope of the invention and that structures and methods within the scope of these claims and their equivalents be covered thereby.

What is claimed is:

1. An imager comprising:
   a first region of semiconductor material, the first region of semiconductor material having a first conductivity type, the first semiconductor region being free of germanium;
   a second region of semiconductor material located on the first region of semiconductor material, the second region of semiconductor material having a second conductivity type, the second semiconductor region being free of germanium; and
   a third region of semiconductor material located on the second region of semiconductor material, the third region of semiconductor material including silicon and germanium and having the second conductivity type.

2. The imager of claim 1 wherein the second semiconductor region includes silicon.

3. The imager of claim 1 wherein the first and second semiconductor regions include silicon.

4. An imager comprising:
   a first region of semiconductor material, the first region of semiconductor material having a first conductivity type;
   a second region of semiconductor material located on the first region of semiconductor material, the second region of semiconductor material having a second conductivity type;
   a third region of semiconductor material located on the second region of semiconductor material, the third region of semiconductor material including silicon and germanium and having the second conductivity type; and a fourth region of semiconductor material located on the third region of semiconductor material, the fourth region of semiconductor material having the second conductivity type and being free of germanium.

5. The imager of claim 4 wherein the second semiconductor region is free of germanium.

6. The imager of claim 5 wherein the second and fourth regions of semiconductor material include silicon.

7. The imager of claim 4 wherein the fourth region of semiconductor material has a greater dopant concentration than the second region of semiconductor material.

8. An imager comprising:
a first region of semiconductor material, the first region of semiconductor material having a first conductivity type;
a second region of semiconductor material located on the first region of semiconductor material, the second region of semiconductor material having a second conductivity type;
a third region of semiconductor material located on the second region of semiconductor material, the third region of semiconductor material including silicon and germanium and having the second conductivity type;
a fourth region of semiconductor material located on the third region of semiconductor material, the fourth region of semiconductor material having the second conductivity type and being free of germanium;
a fifth region of semiconductor material located on the fourth region of semiconductor material, the fifth region of semiconductor material having the first conductivity type;
a sixth region of semiconductor material located on the fifth region of semiconductor material, the fifth region of semiconductor material having the second conductivity type; and
a seventh region of semiconductor material located on the sixth region of semiconductor material, the seventh region of semiconductor material including silicon and germanium and having the second conductivity type.

9. The imager of claim 8 wherein the second and sixth semiconductor regions are free of germanium.

10. The imager of claim 9 wherein the second and sixth semiconductor regions include silicon.

11. The imager of claim 9 wherein the first and fifth semiconductor regions are free of germanium.

12. The imager of claim 11 wherein the first, second, fifth, and sixth semiconductor regions include silicon.

13. The imager of claim 8 and further comprising an eighth region of semiconductor material located on the seventh region of semiconductor material, the eighth region of semiconductor material having the second conductivity type and being free of germanium.

14. A method of forming an imager, the method comprising the steps of:
forming a first region of semiconductor material, the first region of semiconductor material having a first conductivity type and being free of germanium; and
forming a second region of semiconductor material on the first region of semiconductor material, the second region of semiconductor material having a second conductivity type and being free of germanium; and
forming a third region of semiconductor material on the second region of semiconductor material, the third region of semiconductor material including silicon and germanium and having the second conductivity type.

15. The method of claim 14 wherein the second semiconductor region includes silicon.

16. The method of claim 14 and further comprising the step of forming a fourth region of semiconductor material on the third region of semiconductor material, the fourth region of semiconductor material having the second conductivity type and a greater dopant concentration than the third region, and being free of germanium.

17. The imager of claim 1 and further comprising:
a conductive region that contacts the first region of semiconductor material; and
a first isolation region that contacts the second and third regions of semiconductor material and the conductive region to isolate the second and third regions of semiconductor material from the conductive region.

18. The imager of claim 17 and further comprising:
a plurality of layers of semiconductor material formed over the third region of semiconductor material, the plurality of layers of semiconductor material including a first layer having the first conductivity type and a second layer having the second conductivity type, the first layer contacting the conductive region;
a second isolation region that contacts the plurality of layers of semiconductor material and the conductive region to isolate layers with the second conductivity type from the conductive region.

19. The imager of claim 4 and further comprising:
a first plurality of layers of semiconductor material formed over the fourth region of semiconductor material, the plurality of layers of semiconductor material including a first layer having the first conductivity type and a second layer having the second conductivity type;
a conductive region that contacts the fourth region of semiconductor material; and
an isolation region that contacts the first plurality of layers of semiconductor material and the conductive region to isolate the first plurality of layers of semiconductor material from the conductive region.

20. The imager of claim 19 and further comprising a second plurality of layers of semiconductor material formed over the first plurality of layers of semiconductor material, the second plurality of layers of semiconductor material including a first layer having the first conductivity type and a second layer having the second conductivity type, the isolation region isolating the conductive region from the second plurality of layers of semiconductor material.

21. An imager, comprising:
a first region of semiconductor material, the first region of semiconductor material having a first conductivity type and being free of germanium;
a second region of semiconductor material on the first region of semiconductor material, the second region of semiconductor material having a second conductivity type and being free of germanium.

22. The imager of claim 21 and further comprising:
a third region of the semiconductor material located below the second region, the third region being a first conductivity type, and having a layer that includes silicon germanium and a layer that is free of germanium;
a fourth region of the semiconductor material located below the third region, the fourth region of semiconductor material contacting the third region and being the second conductivity type.

23. The imager of claim 22 wherein the fourth region is free of germanium.

24. The imager of claim 22 and further comprising:

a fifth region of the semiconductor material located below the fourth region, the fifth region being a first conductivity type, and having a layer that includes silicon germanium and a layer that is free of germanium;

a sixth region of the semiconductor material located below the fifth region, the sixth region of semiconductor material being the second conductivity type.

25. The imager of claim 24 wherein the fourth region is free of germanium.

26. The imager of claim 24 wherein the first region includes:

a first silicon layer that is free of germanium;

a silicon germanium layer that contacts the first silicon layer; and a second silicon layer that is free of germanium and spaced apart from the first silicon layer, the second silicon layer contacting the silicon germanium layer.

27. The imager of claim 26 wherein the second silicon layer contacts the second region.

28. The imager of claim 22 wherein:

the first region includes:

a first silicon layer that is free of germanium;

a first silicon germanium layer that contacts the first silicon layer; and a second silicon layer that is free of germanium and spaced apart from the first silicon layer, the second silicon layer contacting the first silicon germanium layer, and the third region includes:

a third silicon layer that is free of germanium;

a second silicon germanium layer that contacts the third silicon layer; and a fourth silicon layer that is free of germanium and spaced apart from the third silicon layer, the fourth silicon layer contacting the second silicon germanium layer.

29. The imager of claim 28 wherein the second silicon layer contacts the second region and the fourth silicon layer contacts the fourth region.

* * * * *